US010353149B2

(12) United States Patent
Chang et al.

(10) Patent No.: US 10,353,149 B2
(45) Date of Patent: Jul. 16, 2019

(54) UNIVERSAL OPTICAL FIBER COATING STRIPPER USING GLIDING PLASMA

(71) Applicant: Lightel Technologies, Inc., Renton, WA (US)

(72) Inventors: Hsuan-Chieh Chang, Bonney Lake, WA (US); Shangyuan Huang, Seattle, WA (US)

(73) Assignee: LIGHTEL TECHNOLOGIES, INC., Renton, WA (US)

( * ) Notice: Subject to any disclaimer, the term of this patent is extended or adjusted under 35 U.S.C. 154(b) by 147 days.

(21) Appl. No.: 15/613,068

(22) Filed: Jun. 2, 2017

(65) Prior Publication Data

US 2018/0348433 A1    Dec. 6, 2018

(51) Int. Cl.
  *G02B 6/245* (2006.01)
  *H01J 37/32* (2006.01)
(52) U.S. Cl.
  CPC .......... *G02B 6/245* (2013.01); *H01J 37/3244* (2013.01); *H01J 37/3255* (2013.01); *H01J 37/32669* (2013.01); *H01J 37/32807* (2013.01); *H01J 2237/327* (2013.01); *H01J 2237/33* (2013.01); *H01J 2237/334* (2013.01)
(58) Field of Classification Search
  CPC .. G02B 6/245; H01J 2237/32; H01J 2237/33; H01J 2237/334; H01J 2237/327; H01J 37/32009; H01J 37/32798; H01J 37/32807; H01J 37/32018; H01J 37/32027; H01J 37/32055; H01J 37/3244; H01J 37/32449

USPC ........................................ 250/492.1, 492.3
See application file for complete search history.

(56) References Cited

U.S. PATENT DOCUMENTS

| 7,555,188 B2* | 6/2009 | Wiley | G02B 6/245 385/134 |
| 2012/0090985 A1* | 4/2012 | Rabinovich | B01J 19/088 204/170 |

OTHER PUBLICATIONS

Fridman, A., et. al.,"Characteristics of Gliding Arc and Its Application in Combustion Enhancement", Journal of Propulsion and Power, vol. 24, No. 6, Nov. 2008, pp. 1216-1228.*

* cited by examiner

*Primary Examiner* — Philip C Tucker
*Assistant Examiner* — Jimmy R Smith, Jr.
(74) *Attorney, Agent, or Firm* — Han IP PLLC; Andy M. Han (57) ABSTRACT

An optical fiber coating stripper includes a pair of electrodes, each of which having a discharge head portion and an electrode portion, and a gliding plasma (GP) head housing the electrodes therein. The GP head includes internal airflow channels. The pair of electrodes are disposed at a front end of the GP head and form an air gap therebetween. Each of the discharge head portion includes a curved portion with a rib-shaped protrusion extending in a longitudinal direction of the discharge head portion. In operation, the electrodes are connected to non-alternating electrically positive and negative polarities. When a gas flows through the internal airflow channels in a direction a back end of the GP head toward the front end, a tongue-shaped GP flow is formed in the air gap between the rib-shaped protrusions of the discharge head portions.

20 Claims, 9 Drawing Sheets

Gas Flow

FIG. 1

(Prior Art)

View from A:

Front View

Back View

UNIVERSAL OPTICAL FIBER COATING STRIPPER USING GLIDING PLASMA

TECHNICAL FIELD

The present disclosure relates to optical fiber coating stripping and, more specifically, to a fiber coating stripper based on gliding plasma technology.

BACKGROUND

An optical fiber consists of a core surrounded by a cladding layer. Both the core and the cladding layer are made of dielectric materials. Glass fibers belong to the most popular type of optical fibers whose core and cladding layer are both made from silica. Furthermore, a protection buffer layer is coated outside the cladding layer to protect the very delicate strands of silica fiber from moisture and physical damage. An optical fiber buffer could include one or two protection layers that are applied during the fiber draw.

There exist many different coating options for different applications and each has its particular strengths. The most common coating materials for glass fibers include acrylate, high-temperature acrylate, fluoroacrylate, silicone, silicone/acrylate, polyimide, carbon, metal, and the like. Some fibers even have two layers of coatings, with a softer inner layer and a much stiffer outer layer to respectively cushion the glass from external mechanical loads and also protect the fiber from abrasion.

Optical fiber coating stripping is an essential fiber preparation step, involved in almost all fiber optic component fabrications, fiber processing, or fiber terminations. Based on different purposes, a fiber stripping could be at the fiber tip end (i.e., end-stripping) or in a middle zone of the fiber (i.e., window-stripping). For examples, end-stripping is needed for fiber termination before a fiber connecrization or a fiber splicing, while window-stripping is needed before making a fused coupler or before writing a fiber Bragg grating.

Traditional fiber coating stripping technologies may be mechanical (or thermal-mechanical) based and chemical based. Mechanical or thermal-mechanical stripping may involve physical interference between the stripper blade and the fiber glass surface, which may introduce cracks on the fiber glass and thus degrade the fiber tensile strength. Chemical stripping uses hot acid or solvent, which may introduce possibility of chemical solutions entering into the space between the cladding and coating. Thus, with chemical stripping, serious consequences in time, causing damage of the core may result. Besides, chemical stripping involves obvious safety and environmental issues.

Plasma stripping and laser stripping are newer fiber stripping techniques developed in recent years. They both belong to a "non-contact" stripping process (although the fiber is still contacted by hot air steam or laser light beam). For example, there exist several plasma-based solutions that use either a traditional two-electrode configuration or a multi-electrode configuration. In these solutions the electrodes are disposed in a specific gas or a vacuum (or partial vacuum) ambience.

Several commercial "non-contact" stripping apparatuses have been released in the past years, including plasma-based strippers and laser-based strippers. However, they are all limited to stripping polyimide coating only.

Thus, there is a need for a "non-contact" stripper. First of all, there is a need for a solution that is able to strip most common types of fiber coatings. Furthermore, there is a need for a solution that can work under an ambient condition and require low maintenance.

SUMMARY

In one aspect, an optical fiber coating stripper may include a pair of electrodes, a pair of magnets, and a gliding plasma (GP) head housing the electrodes and magnets therein. The GP head housing may also include internal airflow channels. Each of the electrodes may include a discharge head portion and an electrode portion. The pair of magnets may be disposed on two opposite sides of the pair of electrodes. Each of the discharge head portion may include a curved portion with a rib-shaped protrusion extending in a longitudinal direction of the discharge head portion.

In operation, the pair of electrodes may be connected to an electrically positive polarity and an electrically negative polarity, respectively, with the positive and negative polarities being non-alternating. When a gas flows through the internal airflow channels of the GP head in a direction from the back end toward the front end, a tongue-shaped GP flow may be formed in the air gap between the rib-shaped protrusions of the discharge head portions of the pair of electrodes. The pair of magnets may exert a Lorentz force on ions in the GP flow in a direction opposite to a direction of the GP flow.

BRIEF DESCRIPTION OF THE DRAWINGS

The accompanying drawings are included to aid further understanding of the present disclosure, and are incorporated in and constitute a part of the present disclosure. The drawings illustrate a select number of embodiments of the present disclosure and, together with the detailed description below, serve to explain the principles of the present disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

The present disclosure provides a fiber stripper that is based on gliding plasma technology. Gliding plasma herein refers to a unique non-thermal plasma that can be operated under atmospheric pressure and ambient temperature, thus allowing a friendly operating condition.

Figure 1:
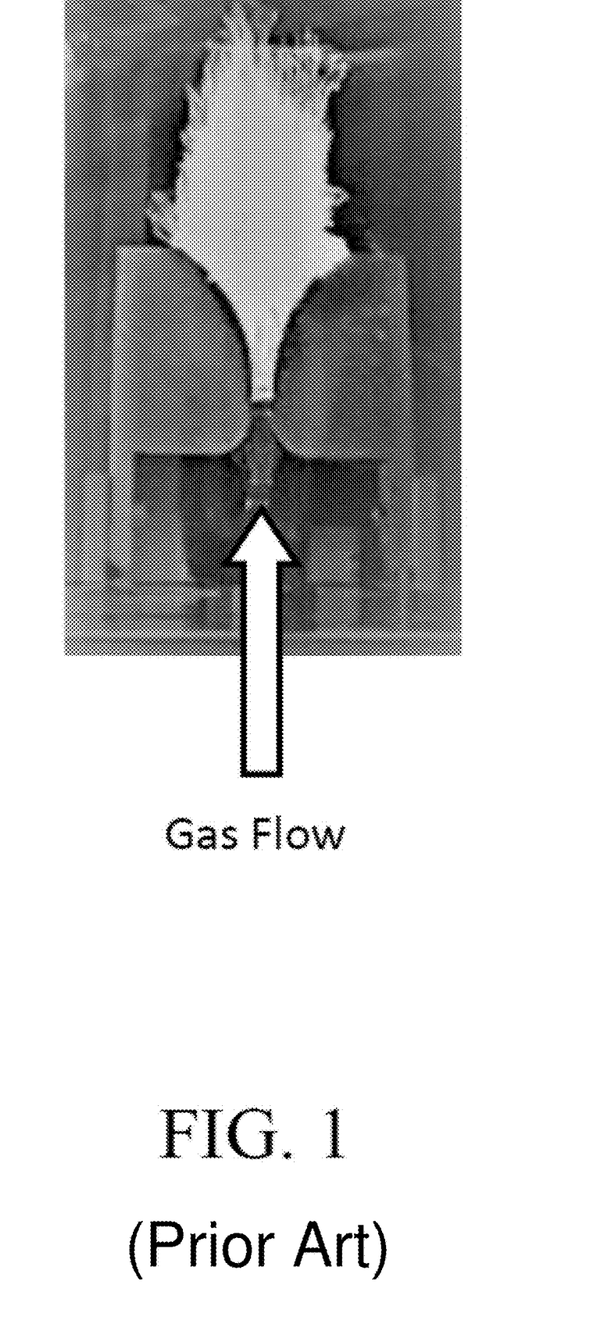
FIG. 1 is a photograph of a traditional gliding plasma arc discharge.

Gliding plasma (GP) is normally generated between two diverging electrodes in a gas flow of air, nitrogen, or some other choices of gas. Typically, the gas flow passes through a gap between two curved electrodes, from a narrow side towards an open side. FIG. 1 shows a traditional GP flow. The discharge ignites at the shortest gap between the two curved electrodes. This narrowest gap is typically in an order of a few millimeters. At this position, a hot quasi-thermal plasma arc, at a temperature greater than or equal to 1000° C., is initiated and then the arc elongates by the gas flow towards the open side of the electrodes, where the gap between the two curved electrodes is wider. With the arc elongation, the ionization reduces and the plasma is converted from quasi-thermal to non-thermal. Since the elongated arc demands more power to sustain itself, it cools down along the direction of gas flow until reaching an extinguishing point when the power supply can no longer compensate the energy lost through heat transfer to the surrounding gas. Immediately after the arc extinction, a next cycle starts. Such a self-pulsing nature (with a frequency of approximately in the order of several hundreds of Hz) characterizes a typical gliding arc discharge.

Figure 2A:
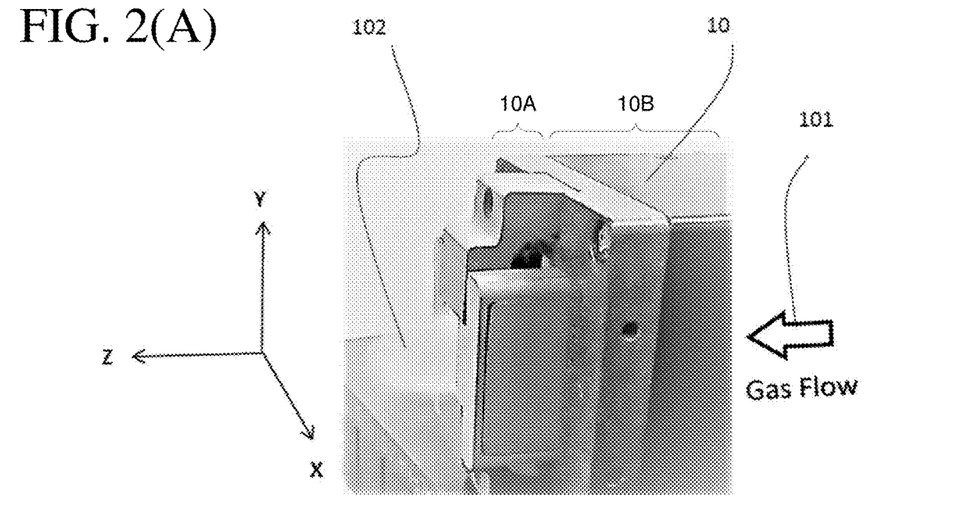
FIG. 2(A) is a photograph of a gliding plasma arc discharge from a specially designed fiber stripper in accordance with an embodiment of the present disclosure.

Traditional GP flow is not very stable due to not only the transient nature of its arc discharge but also the unconfined gas stream. In order to achieve a stable and controllable GP flow (thus a stable and controllable fiber stripping process), a specially designed GP head 10 is presented in FIG. 2(A) according to one embodiment of the present disclosure. As shown in FIG. 2(A), pushed by a gas flow 101, a better controlled GP flow 102 emerges out from a GP head 10 along a Z direction in a X-Y-Z coordinate system shown in FIG. 2(A), where the X-Y plane is substantially parallel to a surface of the GP head 10 from which GP flow 102 emerges. In operations, a fiber to be stripped (not shown) is to be placed in front of GP flow 102, along the X axis.

As shown in FIG. 2(A), in order to cope with very high temperature in the front zone, the front housing portion 10A of the GP head 10 may be made of a special material that can be different from the back housing portion 10B. This special material of the front housing portion 10A may be made of a high-temperature resistant material and preferably may also have the properties of high thermal conductivity and high-voltage insulation. In some embodiments, the front housing portion 10A may be made of a non-metallic material while the back housing portion 10B can be made of a metallic material.

Figure 2B:
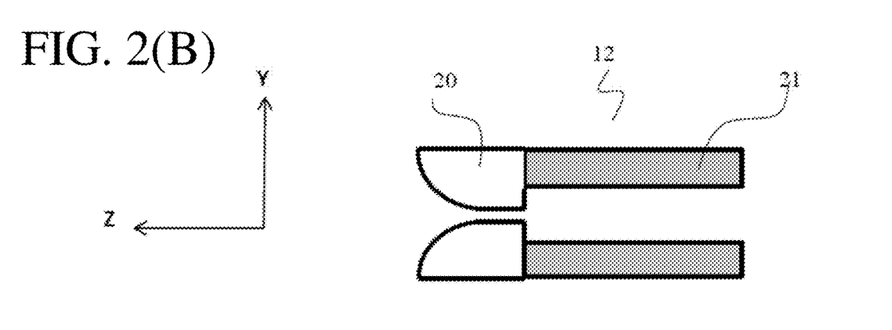
FIG. 2(B) is an illustration of two divergent electrodes inside a stripper head in accordance with an embodiment of the present disclosure.

FIG. 2(B) shows a sketch of a pair of divergent electrodes 12 enclosed inside the GP head 10, and its relative orientation inside the GP head 10 with respect to the X-Y-Z coordinate system shown in FIG. 2(A). Each electrode 12 includes a discharge head 20 and a metal electrode 21. Although the discharge head 20 can be a metallic material (such as tungsten, for example), in some embodiments the preferred material is conductive ceramic that is not only high temperature resistant but also not easy to oxidize.

Figure 3A:
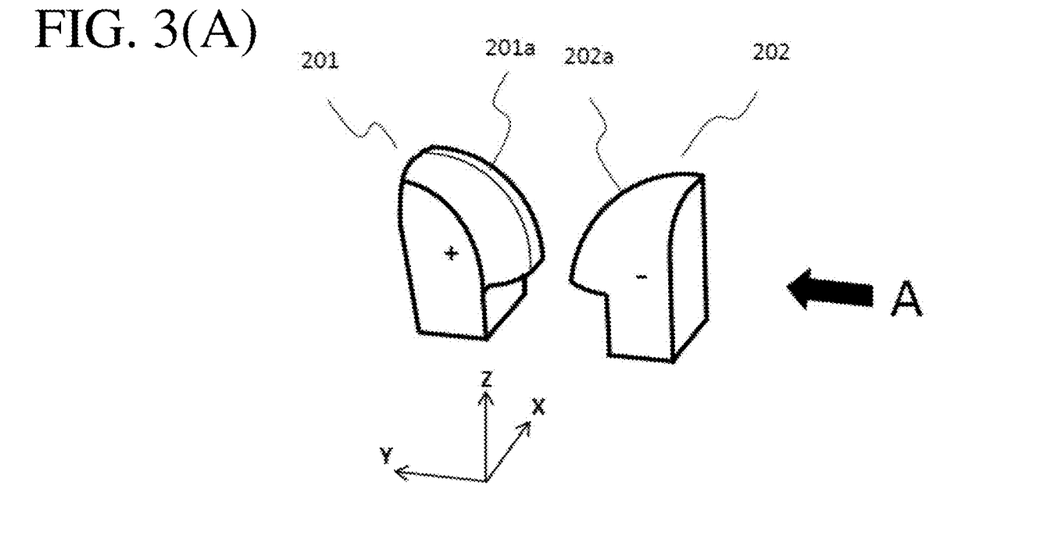
FIG. 3(A) illustrates tip portions of two divergent electrodes in accordance with an embodiment of the present disclosure.

Referring to FIG. 3(A), a design embodiment of two divergent discharge heads 201 and 202 is shown, which may be an example implementation of discharge head 20 of electrode 12. Through the metal electrode portion 21, discharge heads 201 and 202 are connected to an electrically positive (+) polarity and an electrically negative (−) polarity of a high voltage supply, respectively. These two discharge heads 201 and 202 are specially shaped, each with a rib-shaped narrow protrusion 201a/202a along the curved portion of the discharge head in the longitudinal/length-wise direction along the Z axis. The narrow protrusion ribs 201a and 202a restrict the GP arc within a thin layer in the X dimension; but the GP arc is wide in the Y dimension, thus resulting in a 'tongue' shape of the profile of the GP arc. Since the fiber to be stripped is placed along the X axis, i.e., perpendicular to the 'tongue' of the GP arc, an accurate and controllable GP arc, pointing to any specified spot on the fiber, can be achieved. On the other hand, the 'tongue' width allows the GP arc to cover multiple fibers (with such multiple fibers piled along the Y axis) so as to allow stripping of multiple fibers simultaneously or stripping of a ribbon fiber.

It can be seen from FIG. 3(A) that, although the protrusion ribs 201a and 202a of discharge heads 201 and 202 are narrow, the two divergent discharge heads 201 and 202 are still designed with sufficient volume so that they are guaranteed to accommodate sufficient heat capacity under high temperature, especially around the quasi-thermal plasma zone. For example, each of discharge heads 201 and 202 may contain a volume that can withstand a heat capacity in a hot zone of at least 1000° C.

Figure 3B:
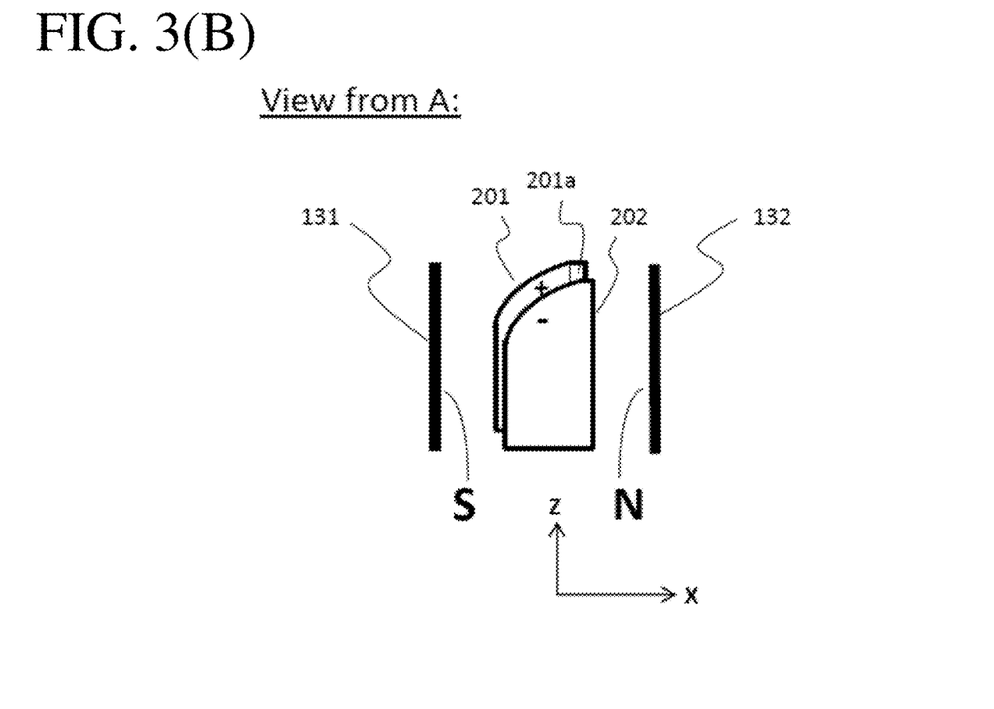
FIG. 3(B) is a perspective view from point A indicated in FIG. 3(A), showing a pair of electrode tips sandwiched between two magnets in accordance with an embodiment of the present disclosure.

FIG. 3(B) is a perspective view from point A shown in FIG. 3(A). As can be seen from FIG. 3(B) that the two discharge heads 201 and 202 are sandwiched between a pair of magnets 131 and 132, and their S and N poles are configured relative to the electrode polarities as indicated in this figure. The purpose of adding a magnetic field is to better control the GP flow. Based on the concept of Lorentz force, the ions produced between discharge heads 201 and 202 are pushed by Lorentz force and intend to move in a direction obeying the Lorentz force law. With a non-alternating polarity of the electrodes such as those of the present embodiment, both the positive ions and negative ions between discharge heads 201 and 202 would experience a force in the same direction. Under the magnet configuration in FIG. 3(B), the Lorentz force is to pull the ions backward, i.e., in a direction opposite to the gas flow. Although the ions are still pushed by the stronger gas flow to move forward, this holding force from the magnetic field formed by magnets 131 and 132 helps to avoid free spreading of the ions.

Figure 4:
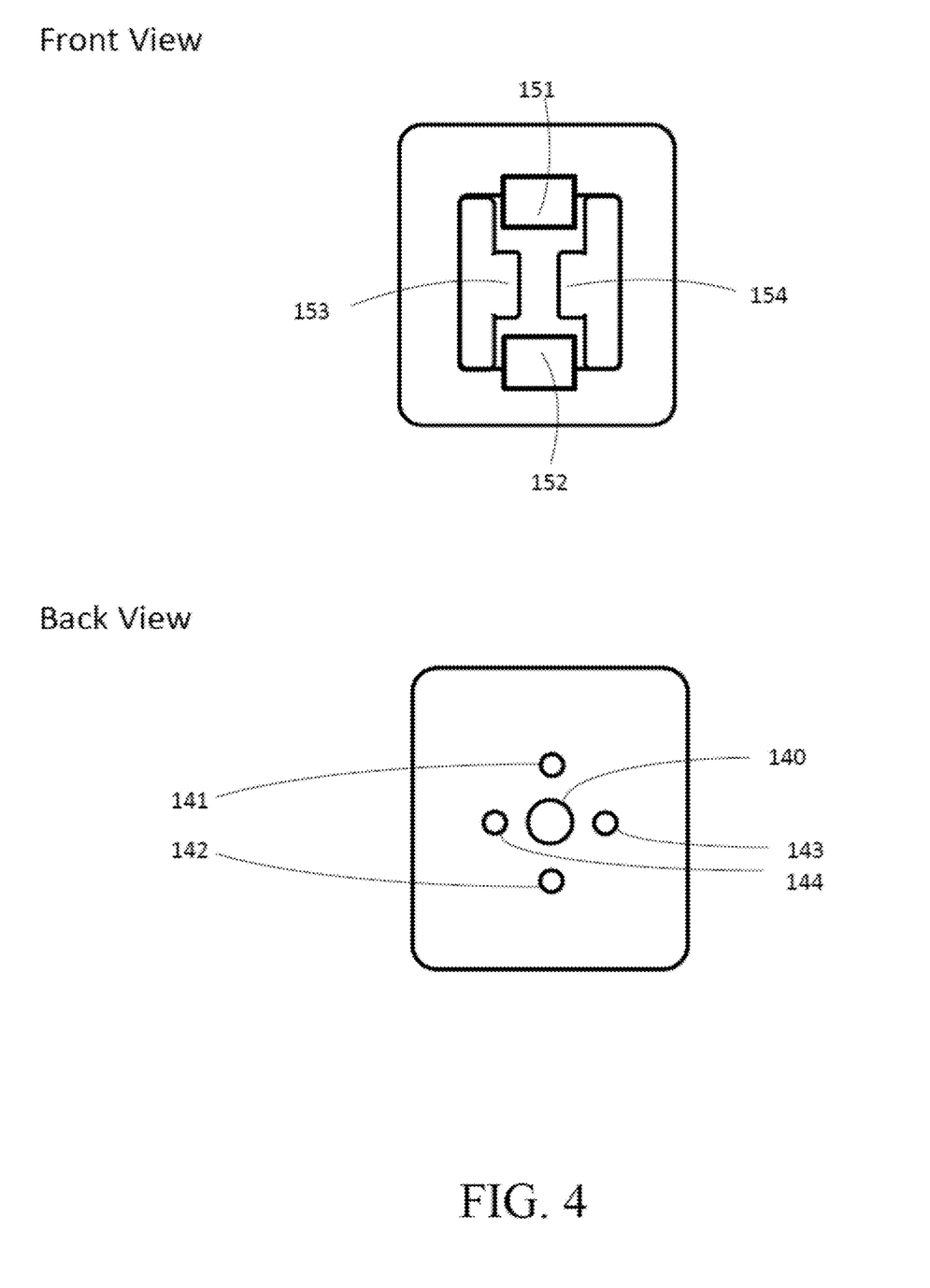
FIG. 4 illustrates a front view and a back view of a gliding plasma head, respectively, in accordance with an embodiment of the present disclosure.

As another feature of the GP head 10, the GP flow profile is further controlled by additional side-airflows. FIG. 4 illustrates the front view and back view of GP head 10. In the back view, a middle gas inlet 140 functions as the main entrance for main gas flow of the gas flow 101 of gliding plasma. A number of side air inlets 141, 142, 143 and 144 function as side-air entrances for introducing side-airflows (these side-airflows are weaker than the main gas flow). By means of internal air guiding channels in GP head 10, these side-airflows are delivered to a front zone of the GP head 10. With such air boundaries, the GP flow shape is confined in both vertical and horizontal dimensions (i.e., in the X and Y directions).

Figure 5A:
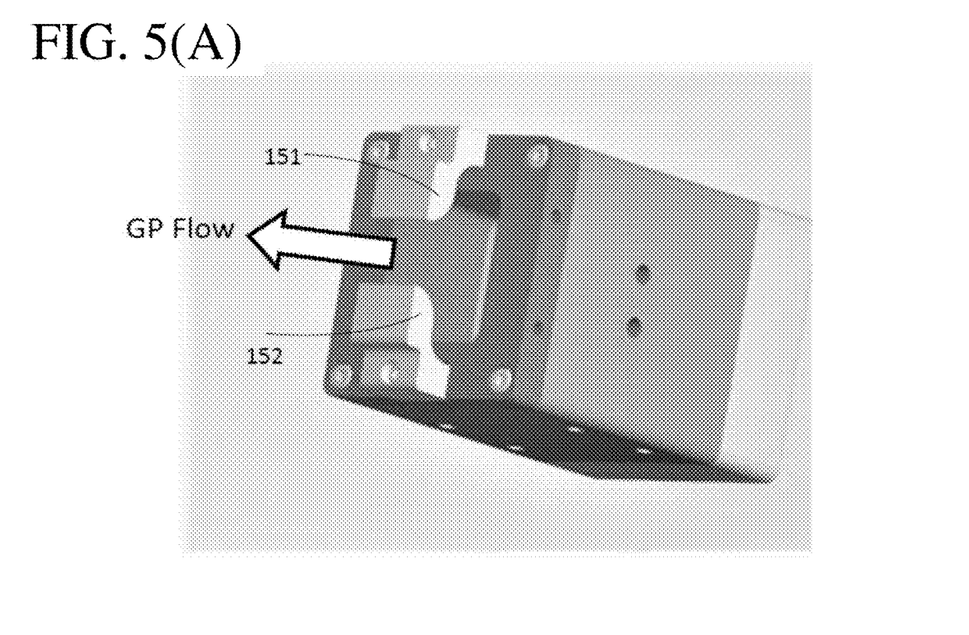
FIGS. 5(A) and 5(B) respectively show an outer housing and an inner housing of a gliding plasma head, with arc-shaped structures to guide all side-airflows, in accordance with an embodiment of the present disclosure.
Figure 5B:
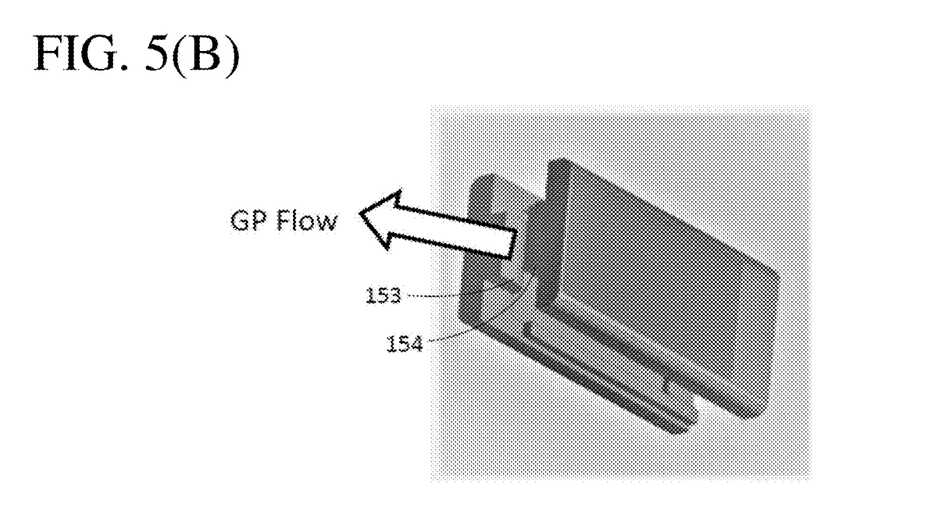

In addition, as shown in FIG. 4, several structures 151, 152, 153 and 154 each with an arc-shaped front tip are provided in the front of GP head 10 to help smoothly lead the side-airflows to the GP zone. Structures 151, 152, 153 and 154 may be made of a heat-resistant and non-electrically conductive material. Refer to the outer housing of the GP head 10 in FIG. 5(A), the arc-shaped airflow guiding pieces 151 and 152 are configured to lead the top airflow and bottom airflow, respectively. Similarly, FIG. 5(B) shows the inner housing of GP head 10 with arc-shaped structures 153 and 154 that are respectively configured to lead the left airflow and right airflow.

Figure 6:
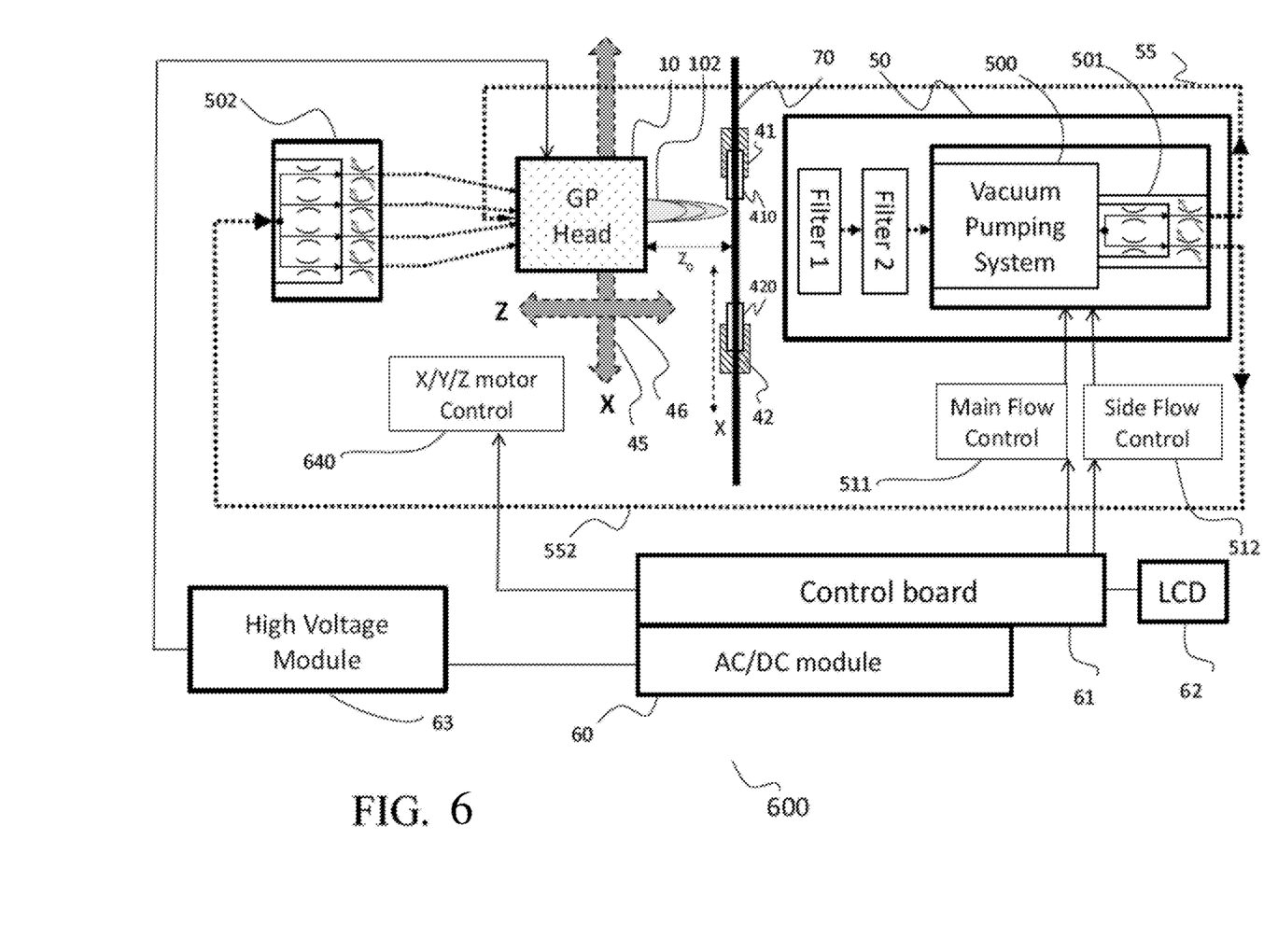
FIG. 6 is a block diagram of a gliding plasma-based fiber stripper in accordance to an embodiment of the present disclosure.

Besides GP head 10, several other important functional modules are also included in the gliding plasma stripper. As one embodiment of present disclosure, the block diagram of a stripper 600 is illustrated in FIG. 6 with the system configuration and also the process control. A fiber 70 to be stripped is positioned in front of the GP flow 102 from GP head 10. Controlled via program, the GP head 10 can be translated or otherwise moved in X (as shown by 45), Y (not shown, but would point toward the reader), and Z (as shown by 46) directions. Other than bringing the GP head 10 in or out of its working scene, movements in the X, Y and/or Z directions are also used for the GP flow scanning or position adjustments. For example, its X-scan along the X axis is for stripping along a fiber, while the Y-scan along the Y axis is to cover extended fiber array that are piled along the Y axis.

The GP flow 102 has a temperature distribution and the temperature may decrease along with its moving direction. Therefore, for different types of coating material, a Z-adjustment of the GP head 10 may be necessary for achieving different $z_0$ settings ($z_0$ is the distance from fiber 70 to the front face of GP head 10). For example, stripping a tough polyimide coating requires a smaller z0 than that required for stripping an acrylate coating.

As an alternative embodiment, instead of moving the GP head 10, the XYZ translation stages can be installed on a fiber holder which holds fiber 70. In this case, the fiber 70 can be XYZ-moved relative to a stationary GP flow 102.

Figure 7:
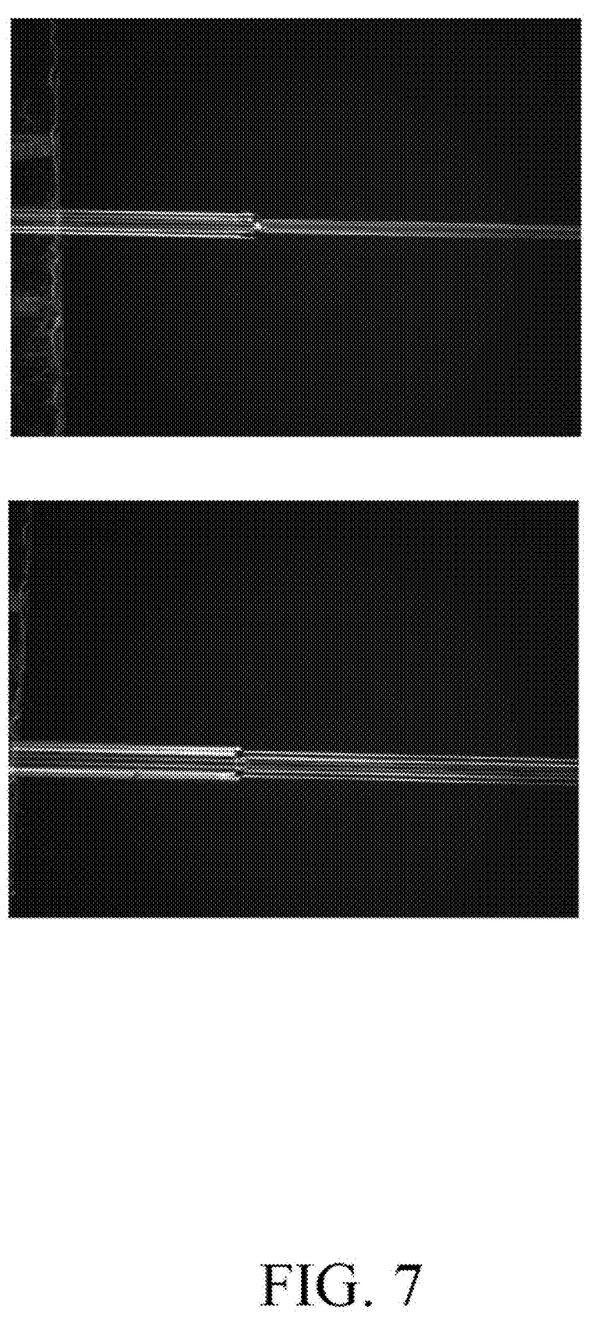
FIG. 7 shows photographs of stripped fibers using a fiber stripper in accordance with an embodiment of the present disclosure.

In operation, fiber 70 is held in place by two fiber clamps (not shown), and these two fiber clamps are mounted on two stands 41 and 42, respectively. In some embodiments, either or both of stands 41 and 42 may translate along a sliding guide in the X-direction for adjusting the stripping length. In the example shown in FIG. 6, stand 42 can translate along a sliding guide in the X-direction for adjusting the stripping length. In order to achieve sharp edges at the two ends of a stripping window on the fiber 70, two sleeves 410 and 420 made of a heat-resistant and non-electrically conductive material are respectively fixed on the inner side of stand 41 and 42, respectively. Sleeves 410 and 420 may expose a stripping window of fiber 70, which is a section of fiber 70 on which the coating of fiber 70 is to be stripped or otherwise removed. The position of stand 42 may be adjusted such that the inner edge of sleeve 410 and the inner edge of sleeve 420 can be respectively aligned to the two ends of the stripping window on the fiber 70, to result in clean and sharp edges at the stripped coating of fiber 70. In some embodiments, each of sleeves 410 and 420 may have a C-shaped cross section with its opening facing toward the front (i.e., away from GP head 10) so that they are not blocking the way for fiber loading but they can block the GP flow 102 on their back side. Fiber 70 may be loaded in and unloaded from sleeves 410 and 420 through the opening of the C-shaped cross section of sleeves 410 and 420. By using such sleeves 410 and 420, good stripping results with sharp edges are obtained as shown in FIG. 7. For an end-stripping, either sleeve 410 or 420 is used. In this case, the fiber tip is sticking out from sleeve 410 or 420 with a length to be stripped.

In FIG. 6, the block 50 represents a module for central air supply. In this module, a vacuum pumping system 500 serves as the air source for both purposes, i.e., not only as the source of gas flow (101 in FIG. 2) but also as the source supporting side-airflows. After passing through the unit 501 of air distributor(s) and air valve(s), the air stream from vacuum pumping system 500 is split into two flows, 551 and 552. The flow 551 is directly delivered to the gas inlet 140 (refer to FIG. 4), while the flow 552 is first delivered to unit 502 of air distributor(s) and air valve(s) for further splitting and valve controls and then guided to the side-air inlets 141~144 respectively.

Back to the block 50 in FIG. 6, there are two filters on the air suction side of the vacuum system 500. These filters are physically located on the way of the GP flow 102 after it passes the fiber 70. During fiber stripping, after passing the fiber 70, the GP flow 102, along with all the stripped fiber coating debris, will be sucked through these filters. The first filter (labeled as "Filter 1" in FIG. 6) is made of heat-resistant foam ceramics that blocks majority of wastes in the hot flow. Then, the flow will continue passing through a second filter (labeled as "Filter 2" in FIG. 6). This filter is made of acticarbon plus a HEPA (high efficiency particulate air) filter so as to further absorb gas odor and remaining impurities. These filters may be installed in a drawer-type scrap collection bin (not shown) that allows easy cleaning and filter replacements.

The bottom portion of FIG. 6 shows the electrical power supply and electrical controls of the stripper 600. An AC/DC module 60 supplies direct current (DC) at 24V, 12V and/or 5V to support all modules or elements. A high voltage module 63 supplies a rectified high voltage (e.g., up to 20 KV) to the plasma electrodes (e.g., electrodes 12 in FIG. 2). A control board 61 is configured to instruct or otherwise control actions of multiple modules, including a XYZ motor control module 640, a main airflow control module 511, and a side-airflow control module 512. In some embodiments, the XYZ motor control module 640 controls three-dimensional (3D) movements/translations of GP head 10 in the X, Y and Z directions relative to fiber 70 which is stationary. Alternatively, the XYZ motor control module 640 controls 3D movements/translations of fiber 70 in the X, Y and Z directions relative to GP head 10 which is stationary. The motor speed is controlled via an integrated circuit (IC), and the airflow rate is controlled using PWM (pulse width modulation) technique. Through the interface of liquid crystal display (LCD) 62, users can easily control operations or input parameters. In addition, multiple stripping recipes for different types of coatings can be stored and recalled for stripping of fibers having different types of coatings.

Figure 8:
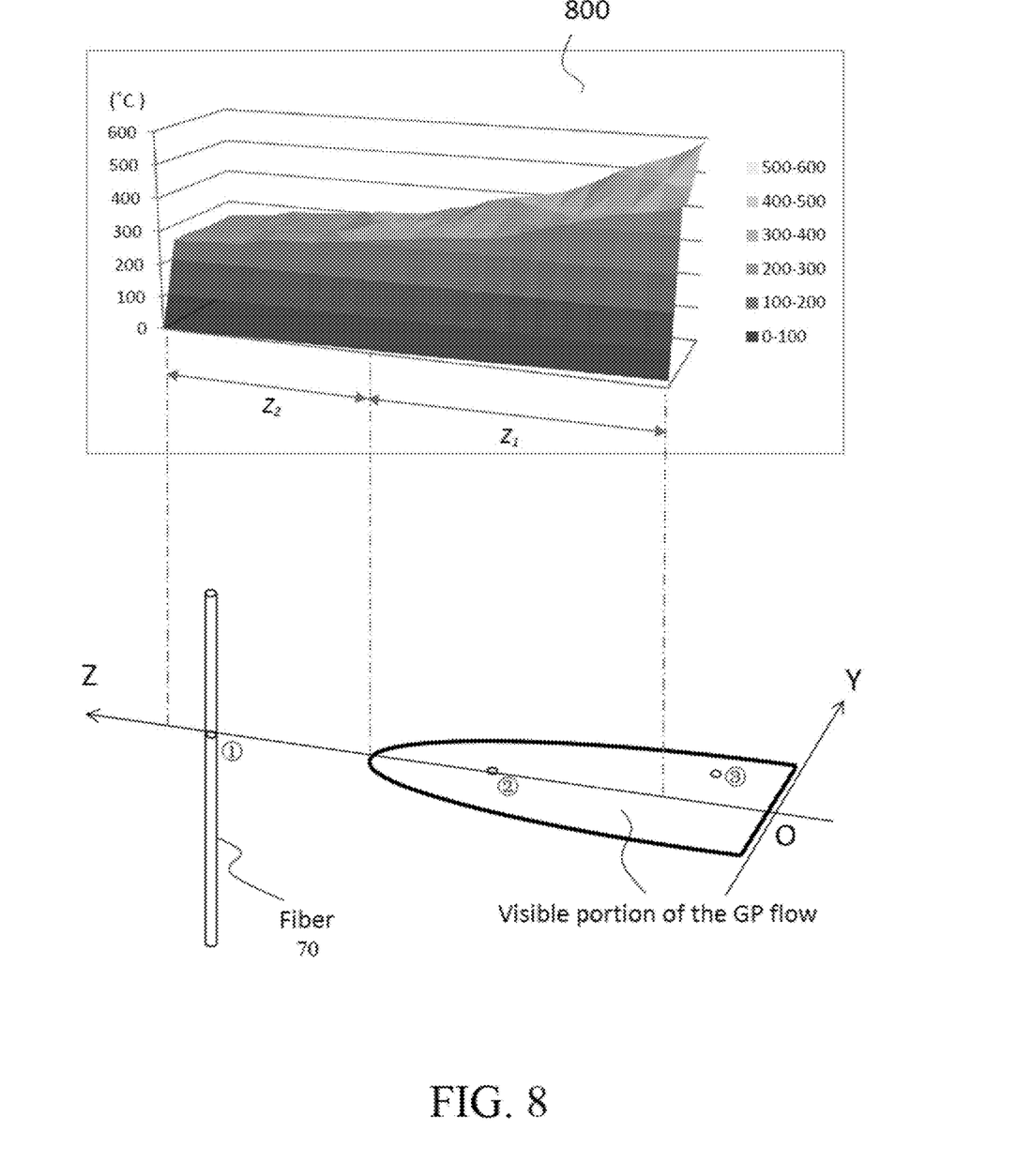
FIG. 8 is a temperature distribution chart measured over a gliding plasma flow of a stripper in accordance with an embodiment of the present disclosure.

As mentioned previously, the 'tongue' shaped GP flow 102 has a profile of temperature distribution. This temperature distribution profile is related to the voltage level from the high-voltage module 63 and also the airflow rate from an air channel 551. A temperature distribution has been measured under a certain operating condition setting. Under such operating condition, the visible portion of the 'tongue' is about 10 mm wide and 17 mm long (from the front surface of the GP head 10). The measurement result is shown as a chart 800 in FIG. 8, which covers two depth zones Z1 and Z2, where Z1 falls into the visible portion of the GP flow 102 and Z2 falls into its invisible extended portion. The chart 800 indicates that Z1 and Z2 zones are within a temperature range of 250~600° C. The temperature is decreasing along Z axis. As for the Y dimension, temperature is basically even in zone Z2, but is increasing towards the 'tongue' edge in the zone Z1. Since stripping of different types of coating materials requires different temperatures, users may choose different locations for different fibers. For example, referring to FIG. 8, the position ① is for low temperature need while the positions ② and ③ are for higher temperature needs. As alternative approaches, at a given spot, the temperature can also be adjusted through tuning the high-voltage value or tuning the airflow rate.

Using a GP stripper of present disclosure (e.g., stripper 600), almost all types of fiber coatings can be stripped, for either window-stripping or end-stripping. In terms of the stripping process, except requiring different temperatures for different types of coatings, different cycles of GP scans may also be required. For example, an acrylate coating only needs a low temperature and one cycle of scan, while a polyimide coating requires a higher temperature and multiple scans. For a dual-layer-coating fiber, even a hybrid stripping recipe may be required. Nevertheless, all these coatings can be stripped with a very clean result without debris residues left on the fiber surface (as shown in FIG. 7).

As observed with embodiments of the GP stripper of present disclosure, stripping different materials of fiber coatings may involve different ablation mechanisms, including a pyrolytic/ultraviolet (UV) photolytic hybrid process (e.g., for acrylate coating), a non-combustive explosion (e.g., for hard polymer coating), or a vaporization process (e.g., for polyimide coating), and the like. Under the latter mechanisms all the coating scraps are carried by the airflow and brought into the scrap collection bin, thus no further action needed by the operator. However, stripping of an acrylate coating is somewhat different. Scanned by a hot GP beam, the acrylate coating will become detached from the fiber surface due to non-synchronized thermal expansions between the acrylate and glass materials. This detached loose tube-like acrylate piece should be taken off by the operator. Even under a window stripping, tearing off such a 'loose tube' is very easy. After removing this acrylate piece, the fiber surface is as clean as that shown in FIG. 7.

Figure 9A:
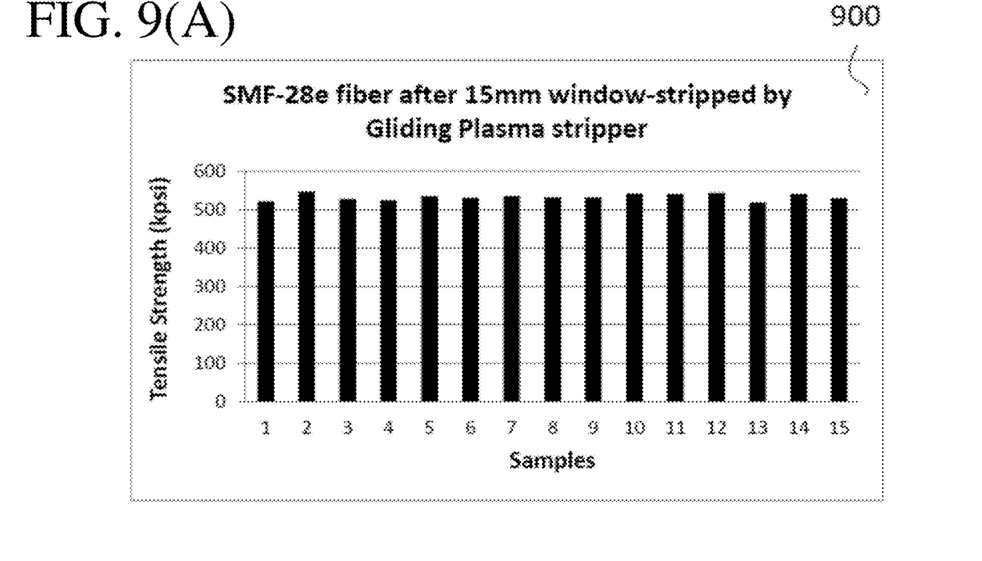
FIGS. 9(A) and 9(B) show test results on fiber tensile strength after fiber stripping. The fifteen samples in FIG. 9(A) are stripped by a gliding plasma stripper in accordance with an embodiment of the present disclosure, while the fifteen samples in FIG. 9(B) are stripped by a manual mechanical stripper.
Figure 9B:
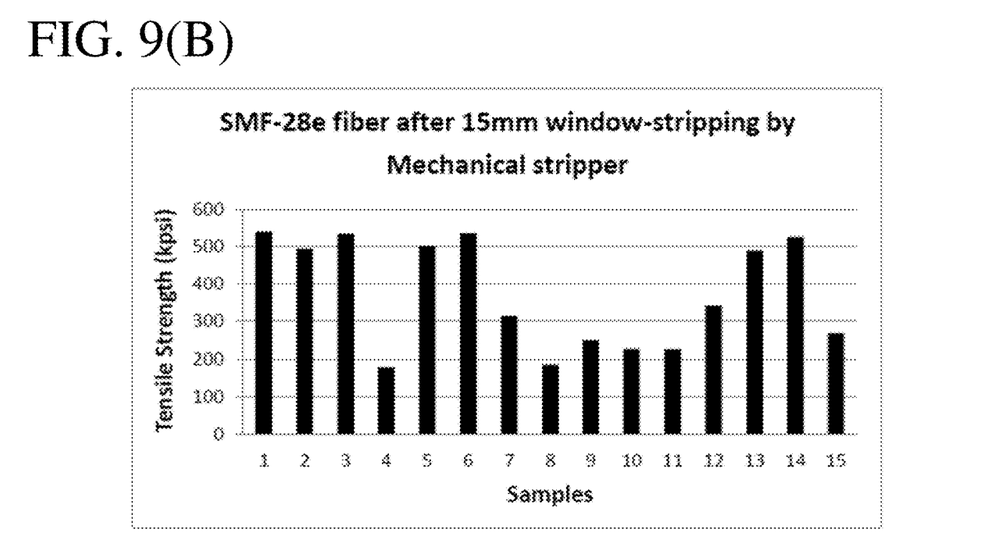

Fibers stripped by a GP stripper (e.g., stripper 600) in accordance with embodiments of the present disclosure have demonstrated high tension strength. A fiber tensile strength test was conducted on stripped fiber samples. In this test the popular Corning SMF-28 single-mode fiber with acrylate coating was used, and the window-stripping length was selected to be 15 mm. FIG. 9(A) shows the test results on fifteen random samples. As shown in chart 900, all samples passed a tensile strength of 500 kpsi, i.e., greater than 4.3 kg loading force. (Note that, as the loading force was not further increased, the stopping points of strength in FIG. 9(A) do not mean the fiber breaking points.) For comparison, a similar test was done by an experienced operator using a traditional manual tool. As shown in FIG. 9(B), the mechanical stripping gave very random results and some samples showed much weaker strength. As mentioned above, multiple cycles of GP scans would be required for stripping some tough fiber coatings, e.g., polyimide or Corning CPC coatings. Of course, using a higher temperature may reduce the GP scan down to one cycle. However, in order to maintain the fiber strength, using a gentler temperature with multiple scans would be recommended.

In order to protect the workers and surroundings from any electromagnetic and UV radiations during plasma arc discharging, embodiments of the GP stripper (e.g., stripper 600) may be enclosed in a metal cover (e.g., iron shell). A viewing window is located in front of the metal cover in order to allow workers to monitor the stripping process inside. This window is made of a conductive ITO (Indium Tin Oxide) coated glass plus a layer of iron mesh so as to keep this area radiation-insulated. For further protection, the cover of this apparatus is interlocked, meaning that an arc discharge cannot be triggered if the cover is not tightly closed.

Highlight of Select Features

In view of the above, select features of various embodiments of the present disclosure are highlighted below.

In one aspect, an apparatus may include an optical fiber coating stripper which may include a pair of electrodes, a pair of magnets, and a gliding plasma (GP) head housing the electrodes and magnets therein. Each of the electrodes may include a discharge head portion and an electrode portion. The discharge head portion may be made of a heat-resistant and electrically-conductive material. The pair of magnets may be disposed on two opposite sides of the pair of electrodes. The GP head may include internal airflow channels.

The GP head may include a front housing portion toward a front end thereof and a back housing portion toward a back end thereof. The front housing portion of the GP head may be made of a special material that is different from a material of the back housing portion. This special material may be not only high-temperature resistant with a high thermal conductivity but also high-voltage insulated. The front housing portion may be made of a non-metallic material, and the back housing portion can be made of a metallic material.

Each of the discharge head portion may include a curved portion with a rib-shaped protrusion extending in a longitudinal direction of the discharge head portion. Moreover, each discharge head portion may contain sufficient volume for sufficient heat capacity. For example, each discharge head may contain a volume that can withstand a heat capacity in a hot zone of at least 1000° C.

In operation, the pair of electrodes may be connected to an electrically positive polarity and an electrically negative polarity, respectively, with the positive and negative polarities being non-alternating. When a gas flows through the internal airflow channels of the GP head in a direction from the back end of the GP head toward the front end of the GP head, a tongue-shaped GP flow may be formed in the air gap between the rib-shaped protrusions of the discharge head portions of the pair of electrodes at the front end of the GP head. The pair of magnets may exert a Lorentz force on ions in the GP flow in a direction opposite to a direction of the GP flow.

In some embodiments, the discharge head portion of at least one of the electrodes may be made of a metallic material.

In some embodiments, the discharge head portion of at least one of the electrodes may be made of a conductive ceramic material.

In some embodiments, the apparatus may also include a top arc-shaped airflow guiding piece and a bottom arc-shaped airflow guiding piece. The top airflow guiding piece may be disposed at the front end of the GP head and configured to guide a top airflow out of one or more of the internal airflow channels. The bottom airflow guiding piece may be disposed at the front end of the GP head and configured to guide a bottom airflow out of one or more of the internal airflow channels.

In some embodiments, the apparatus may also include a left arc-shaped structure and a right arc-shaped structure. The left arc-shaped structure may be disposed at the front end of the GP head and configured to guide a left airflow out of one or more of the internal airflow channels. The right arc-shaped structure may be disposed at the front end of the GP head and configured to guide a right airflow out of one or more of the internal airflow channels.

In some embodiments, the apparatus may also include a control module that controls three-dimensional (3D) movements of the GP head relative to a fiber to be stripped which is stationary.

In some embodiments, the apparatus may also include a control module that controls 3D movements of a fiber to be stripped relative to the GP head which is stationary.

In some embodiments, the apparatus may also include a pumping system that supplies the gas to flow through the internal airflow channels of the GP head.

In some embodiments, the internal airflow channels may include a central channel and a plurality of side channels surrounding the central channel.

In some embodiments, the apparatus may also include a first unit of one or more air distributors and one or more air valves. The pumping system may supply a first portion of the gas to the central channel of the GP head through the first unit of one or more air distributors and one or more air valves.

In some embodiments, the apparatus may further include a second unit of one or more air distributors and one or more air valves. The pumping system may supply a second portion of the gas to the side channels of the GP head through the first unit of one or more air distributors and one or more air valves and the second unit of one or more air distributors and one or more air valves.

In some embodiments, the apparatus may also include a first filter made of heat-resistant foam ceramics through which the pumping system sucks an ambient gas to provide the gas.

In some embodiments, the apparatus may further include a second filter made of acticarbon plus a HEPA (high efficiency particulate air) filter.

In some embodiments, the apparatus may further include first and second stands as well as first and second clamps. The first and second clamps may be disposed on the first and second stands, respectively, to hold a fiber to be stripped in place.

In some embodiments, at least one of the first stand and the second stand may be configured to translate along a sliding guide in a direction to adjust a stripping length of the fiber.

In some embodiments, the apparatus may further include first and second sleeves that are disposed on the first and second stands, respectively, and expose a stripping window of the fiber for stripping.

In some embodiments, each of the first sleeve and the second sleeve may be made of a heat-resistant and non-electrically conductive material. Moreover, each of the first sleeve and the second sleeve may have a C-shaped cross section with an opening of the C-shaped cross section facing away from the GP head.

In some embodiments, the apparatus may further include a metal cover that encloses the optical fiber coating stripper therein and blocks electromagnetic and ultraviolet (UV) radiations from the plasma. The metal cover may include a viewing window configured to allow an operator to view the optical fiber coating stripper from an exterior of the metal cover. The metal cover may interlock an operation of the optical fiber coating stripper such that the optical fiber coating stripper is prevented from triggering an arc discharge in an event that the metal cover is not fully closed.

In some embodiments, the viewing window may include a conductive indium tin oxide (TIO) coated glass and a layer of iron mesh.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An apparatus, comprising:
an optical fiber coating stripper comprising:
  a pair of electrodes, each of the electrodes comprising a discharge head portion and an electrode portion;
  a pair of magnets disposed on two opposite sides of the pair of electrodes; and
  a gliding plasma (GP) head housing the electrodes and magnets therein, the GP head comprising internal airflow channels,
wherein:
  each of the discharge head portions comprises a curved portion with a rib-shaped protrusion extending in a longitudinal direction of the respective discharge head portion,
  each of the discharge head portions is made of a heat-resistant and electrically-conductive material,
  in operation, the pair of electrodes are connected to an electrically positive polarity and an electrically negative polarity, respectively, with the positive and negative polarities being non-alternating,
  in operation, when a gas flows through the internal airflow channels of the GP head in a direction from a back end of the GP head toward a front end of the GP head, a tongue-shaped GP flow is formed in an air gap between the rib-shaped protrusions of the discharge head portions of the pair of electrodes at the front end of the GP head, and
  in operation, the pair of magnets exert a Lorentz force on ions in the GP flow in a direction opposite to a direction of the GP flow.

2. The apparatus of claim 1, wherein the GP head comprises a front housing portion toward the front end thereof and a back housing portion toward the back end thereof, and wherein the front housing portion is made of a high-temperature resistant material.

3. The apparatus of claim 1, wherein each of the discharge head portions contains a volume that can withstand a heat capacity in a hot zone of at least 1000° C.

4. The apparatus of claim 1 wherein the discharge head portion of at least one of the electrodes is made of a metallic material or a conductive ceramic material.

5. The apparatus of claim 1, further comprising:
  a top arc-shaped airflow guiding piece disposed at the front end of the GP head and configured to guide a top airflow out of one or more of the internal airflow channels; and
  a bottom arc-shaped airflow guiding piece disposed at the front end of the GP head and configured to guide a bottom airflow out of one or more of the internal airflow channels.

6. The apparatus of claim 5, further comprising:
a left arc-shaped structure disposed at the front end of the GP head and configured to guide a left airflow out of one or more of the internal airflow channels; and
a right arc-shaped structure disposed at the front end of the GP head and configured to guide a right airflow out of one or more of the internal airflow channels.

7. The apparatus of claim 1, further comprising:
a control module that controls three-dimensional (3D) movements of the GP head relative to a fiber to be stripped which is stationary.

8. The apparatus of claim 1, further comprising:
a control module that controls three-dimensional (3D) movements of a fiber to be stripped relative to the GP head which is stationary.

9. The apparatus of claim 1, further comprising:
a pumping system that supplies the gas to flow through the internal airflow channels of the GP head.

10. The apparatus of claim 9, wherein the internal airflow channels comprise a central channel and a plurality of side channels surrounding the central channel.

11. The apparatus of claim 10, further comprising:
a first unit of one or more air distributors and one or more air valves,
wherein the pumping system supplies a first portion of the gas to the central channel of the GP head through the first unit of one or more air distributors and one or more air valves.

12. The apparatus of claim 11, further comprising:
a second unit of one or more air distributors and one or more air valves,
wherein the pumping system supplies a second portion of the gas to the side channels of the GP head through the first unit of one or more air distributors and one or more air valves and the second unit of one or more air distributors and one or more air valves.

13. The apparatus of claim 9, further comprising:
a first filter made of heat-resistant foam ceramics through which the pumping system sucks an ambient gas to provide the gas.

14. The apparatus of claim 13, further comprising:
a second filter comprising a high efficiency particulate air (HEPA) filter.

15. The apparatus of claim 1, further comprising:
first and second stands; and
first and second clamps disposed on the first and second stands, respectively, to hold a fiber to be stripped in place.

16. The apparatus of claim 15, wherein at least one of the first stand and the second stand is configured to translate along a sliding guide in a direction to adjust a stripping length of the fiber.

17. The apparatus of claim 15, further comprising:
first and second sleeves disposed on the first and second stands, respectively, and configured to hold the fiber and expose a stripping window of the fiber for stripping.

18. The apparatus of claim 17, wherein each of the first sleeve and the second sleeve is made of a heat-resistant and non-electrically conductive material, and wherein each of the first sleeve and the second sleeve has a C-shaped cross section with an opening of the C-shaped cross section facing away from the GP head.

19. The apparatus of claim 1, further comprising:
a metal cover that encloses the optical fiber coating stripper therein and blocks electromagnetic and ultraviolet (UV) radiations from the GP flow,
wherein:
the metal cover comprises a viewing window configured to allow an operator to view the optical fiber coating stripper from an exterior of the metal cover, and
the metal cover interlocks an operation of the optical fiber coating stripper such that the optical fiber coating stripper is prevented from triggering an arc discharge in an event that the metal cover is not fully closed.

20. The apparatus of claim 19, wherein the viewing window comprises a conductive indium tin oxide (TIO) coated glass and a layer of iron mesh.

* * * * *